United States Patent [19]

Besomi et al.

[11] Patent Number: 4,601,888
[45] Date of Patent: Jul. 22, 1986

[54] PROTECTION OF SEMICONDUCTOR SUBSTRATES DURING EPITAXIAL GROWTH PROCESSES

[75] Inventors: Paul R. Besomi, Plainfield; Ronald J. Nelson, Berkeley Heights; Randall B. Wilson, Edison, all of N.J.

[73] Assignee: AT&T Bell Laboratories, Murray Hill, N.J.

[21] Appl. No.: 617,491

[22] Filed: Jun. 5, 1984

Related U.S. Application Data

[62] Division of Ser. No. 392,065, Jun. 25, 1982, Pat. No. 4,482,423.

[51] Int. Cl.⁴ .............................................. C30B 19/06
[52] U.S. Cl. .............................. 422/253; 156/DIG. 89
[58] Field of Search .................... 156/622, DIG. 89; 422/253; 118/412

[56] References Cited

U.S. PATENT DOCUMENTS 4,028,146 6/1977 Logan et al. ...................... 156/622
4,315,796 2/1982 Nishizawa ......................... 156/622
4,366,771 1/1983 Bowers et al. ..................... 118/412

OTHER PUBLICATIONS

Digiuseppe et al., Jl. of Crystal Growth, 58 (1982) pp. 279–284.
Antypas, Appl. Phys. Lett. 37(1), Jul. 1, 1980, pp. 64–65.
Doi et al., Appl. Phys. Lett. 34(6), 3/15/79, pp. 393–395.
Clawson et al., Jl. of Crystal Growth, 46 (1979), pp. 300–303.
Pak et al., Jpn. J. Appl. Phys., V18 (1979), No. 9, pp. 1859–1860.
Casey et al., Applied Physics Letters, V30, No. 5, 3/1/77, pp. 247–249.
Wrick et al., Electronics Letters, 8/5/76, V12, No. 16, pp. 394–395.

Primary Examiner—Hiram H. Bernstein
Attorney, Agent, or Firm—Michael J. Urbano

[57] ABSTRACT

Thermal degradation of compound single crystal substrates (e.g., InP) containing a relatively volatile element (e.g., P) prior to LPE growth has been virtually eliminated by an improved protection technique. A partial pressure of the volatile element is provided by a solution (e.g., Sn-In-P) localized inside a chamber which is external to the LPE boat and which surrounds substrate prior to growth, thereby preventing thermal damage to the substrate surface. Applicability of the technique to other epitaxial growth processes (e.g., VPE and MBE) is also discussed.

3 Claims, 1 Drawing Figure

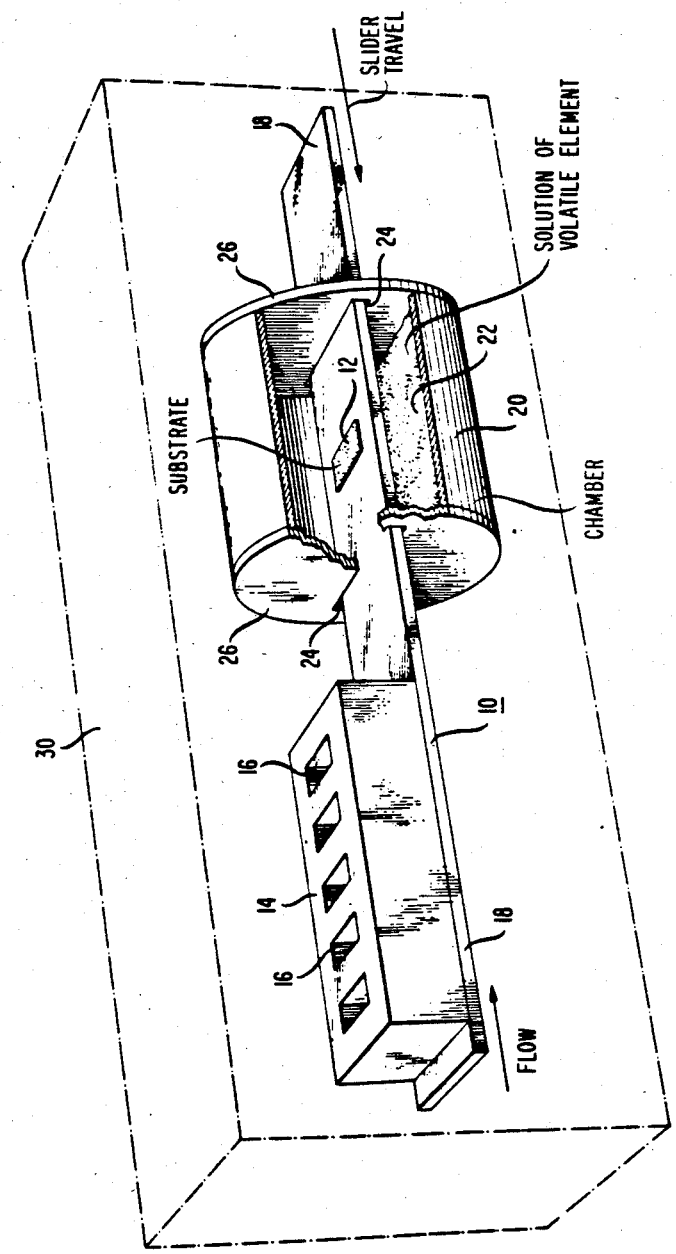

PROTECTION OF SEMICONDUCTOR SUBSTRATES DURING EPITAXIAL GROWTH PROCESSES

This is a division of application Ser. No. 392,065, filed June 25, 1982, now U.S. Pat. No. 4,482,423.

BACKGROUND OF THE INVENTION

This invention relates to epitaxial growth processes and, more particularly, to epitaxial growth on compound semiconductor substrates containing a relatively volatile element. Illustratively, these substrates are Group III-V compounds such as InP or GaAs which are commonly used in the fabrication of GaAs/AlGaAs or InGaAsP/InP semiconductor devices; e.g., lasers and LEDs, photodiodes and FETs. The lasers and LEDs typically have a double heterostructure (DH) geometry which includes a narrow bandgap active layer sandwiched between a pair of wider bandgap cladding layers; e.g., AlGaAs-GaAs-AlGaAs or InP-InGaAsP-InP.

Due to the low absorption coefficient of optical fibers in the 1.3–1.6 $\mu$m wavelength range, InGaAsP/InP DH lasers and LEDs have become extremely promising light sources for light-wave communications. To date, liquid phase epitaxy (LPE) has been the predominant method used to fabricate InGaAsP multilayer structures on InP substrates, but even this growth technique is not perfect, being subject to myriad defects which render devices irreproducible. Among the possible causes of irreproducibility in LPF growth, thermal decomposition of InP substrates is of prime importance. A similar problem exists in vapor phase epitaxy (VPE) and molecular beam epitaxy growth on InP substrates.

In LPE, for example, the loss of phosphorus from the substrates at the high temperatures present during heating cycles results in an indium rich region which in turn creates a perturbed epitaxial layer. Moreover, the etched mesas of buried heterostructure lasers may be damaged by thermal degradation prior to regrowth.

Another problem related to the LPE growth of InGaAsP alloys is the stability of the solid solution epitaxial layer. It has been suggested that quaternary InGaAsP solid solutions may be metastable, resulting in spinoidal decomposition, even at low temperature. In such a case, the growth of other layers after the quaternary active layer, as well as any thermal treatment, could lead to an irreproducible precipitation of the spinoidal solid solutions. This problem may be even further complicated by the presence of a surface strain field due to thermal decomposition, prior to growth of the quaternary active layer. Controlling the thermal degradation of the InP substrates before growth becomes necessary to eliminate the irreproducibility induced by the interface strain field.

One method proposed in the prior LPE art to remove the damaged substrate surface is an in situ etching step, or melt-back technique, described by V. Wrick et al in *Electronics Letters*, Vol. 12, p. 394 (1976). This method, however, leads to nonplanar surface morphology and cannot be used when micron size features, such as etched mesas or channels, are present on the wafer.

Other techniques have been proposed and used with varying degrees of success to prevent thermal decomposition during LPE. First, the use of an InP cover wafer in close proximity to the InP substrate has been shown to significantly reduce the density of etch pits resulting from thermal etching and degradation. See, A. Doi et al, *Applied Physics Letters*, Vol. 34, p. 393 (1979). However, this method suffers from an inherent limitation because the phosphorus pressure in equilibrium with the InP substrate is merely contained, not increased.

Alternative methods were recently proposed in LPE for providing excess phosphorus in the vicinity of the InP substrate by using elemental phosphorus powder, M. A. DiGiuseppe et al, *Journal of Crystal Growth*, Vol. 58, p. 279 (1982), or phosphine (PH$_3$) gas, A. R. Clawson et al, *Journal of Crystal Growth*, Vol. 46, p. 300 (1979). Both methods, however, introduce phosphorus in the entire growth system rather than near the InP substrate only. Moreover, the elemental phosphorus method gave results comparable to the cover waver method as measured by the ratios of integrated photoluminescence intensity in the case of S-doped InP, and very poor protection in the case of both Sn-doped InP and undoped InP.

In the case of the phosphine method, the results showed no change in either physical appearance, electrical characteristics, or photoluminescence. Nevertheless, the decomposition of PH$_3$ into P$_2$ and P$_4$ is not complete and safety precautions associated with the use of toxic gases must be observed.

All of these methods introduce phosphorus into the entire growth system and may modify the melt compositions. Consequently, the development of a method providing excess phosphorus localized to the immediate vicinity of the InP substrate is desirable. Recently, G. A. Antypas reported in *Applied Physics Letters*, Vol. 37, p. 64 (1980) the use of an open graphite basket containing a solution of Sn-In-P for eliminating visible decomposition of InP substrates before and after LPE growth. However, no results of photoluminescence or electrical measurements were provided to substantiate the photomicrographic results.

SUMMARY OF THE INVENTION

In accordance with an illustrative embodiment of our invention, a method of growing a semiconductor layer on a semiconductor substrate, which includes a relatively volatile element, comprises the steps of: (a) heating the substrate to an elevated temperature suitable for growth and above a first temperature at which significant evaporation of the volatile element takes place; (b) growing the semiconductor layer on the substrate by a suitable process such as, for example, LPE, VPE, or MBE; and (c) cooling the substrate and the grown layer to a temperature below the first temperature, characterized in that during at least the time in step (a) when the substrate temperature is above the first temperature, the substrate is surrounded by a chamber containing a gaseous atmosphere of the volatile element of sufficient partial pressure to reduce thermal decomposition of the substrate. In an alternative embodiment, the substrate and layers grown thereon are similarly surrounded by a chamber during the cooling step (c).

Illustratively, thermal decomposition of a compound semiconductor substrate prior to LPE growth is virtually eliminated by surrounding the substrate with a closed chamber, external to the LPE boat, which carries a solution containing the volatile element of the substrate. Preferably, the solution is saturated so as to provide a sufficient partial pressure of the volatile element to eliminate evaporation of that element from the substrate; i.e., to avoid thermal decomposition of the substrate. The closed chamber also confines the volatile element so that it does not contaminate the growth melts in the LPE boat.

In one embodiment directed to LPE growth on InP substrates, the chamber comprises quartz or other suitable, non-reactive material such as graphite and carries a Sn-In-P solution. The chamber has a pair of slots which allows the LPE substrate-carrying slider to be translated therethrough.

Significantly, when our inventive technique is applied to the fabrication of InP-InGaAsP lasers, no meltback procedure is required—a feature particularly advantageous in fabricating buried heterostructure lasers.

BRIEF DESCRIPTION OF THE DRAWING

Our invention, together with its various features and advantages, can be readily understood from the following, more detailed description taken in conjunction with the accompanying drawing, in which the sole FIGURE is an isometric view of LPE boat-slider apparatus including an external chamber in accordance with one embodiment of our invention.

DETAILED DESCRIPTION

For purposes of illustration, our invention will be described in the context of LPE, with it being understood that its application to other epitaxial growth processes, such as VPE and MBE, is relatively straightforward.

With reference now to the FIGURE, there is shown apparatus 10 for use in LPE growth of compound semiconductor epitaxial layers on a single crystal substrate 12. Apparatus 10, which depicts schematically a well-known configuration illustratively comprises a melt holder 14, having a plurality of rectangular wells 16 for containing source solutions or melts from which a plurality of epitaxial layers may be grown. A slider 18 is positioned beneath the holder 14 and the two are mutually adapted for relative translation so that the substrate 12 may be brought sequentially into contact with the source melts in wells 16.

Although not shown, other well-known LPE apparatuses may also be employed. For example, slider 18 typically has a plurality of recesses which carry not only substrate 12 but also a number of well-known saturation seeds (not shown) which precede the substrate under each well. Moreover, an apertured second slider (not shown) may be positioned between the holder 14 and slider 18 in order to skim off the bottom portion of a source solution and deposit that portion on the substrate, another technique well known in the art.

Any or all of these standard LPE apparatuses may be modified in accordance with our invention by the inclusion of a closed chamber 20 which surrounds the substrate 12 and carries a solution 22 containing the volatile element which tends to evaporate from the substrate. Illustratively, the substrate 12 comprises S-doped InP or Sn-doped InP, and the solution 22 comprises a saturated solution of Sn-In-P.

Chamber 20 is depicted as being a circular cylinder although other geometries, such as a rectangular cylinder or parallelepiped, are also suitable. In any event, the chamber is provided with a pair of slots 24, one in each of its opposing end faces 26. These slots are adapted to receive slider 18 and to permit translation of it to bring substrate 12 within the chamber, as shown, prior to LPE growth; i.e., during the initial phases of the LPE cycle when the substrate is being heated to the growth temperature and evaporation of its volatile elements would take place.

However, a second chamber (not shown) may be employed on the opposite side of holder 14 so that substrate 12 (and any layers grown thereon) may be moved into the second chamber after LPE growth; i.e., during the cooling phase of the LPE cycle. The use of the second chamber is of particular significance when the last-grown layer also contains the relatively volatile element.

The slots 24 are designed so that slider 18 fits snugly therein, making chamber 20 relatively gas tight. However, the slots are not coextensive with the diameter of the end faces 26 so that the volatile element evaporates from the solution 22 and provides a partial pressure above substrate 12. Put another way, the width of the slider 18 is less than the diameter of the end face 26 so that the bottom and top of chamber 20 are in gas-flow communication with one another.

The following example describes the application of our invention to the protection of InP substrates from thermal damage prior to LPE growth. Materials, compositions, dimensions and other parameters, such as times and temperatures, are provided by way of illustration only and, unless otherwise stated, are not intended to limit the scope of the invention.

EXAMPLE

Two-inch diameter InP wafers were cut and then polished with bromine/methanol to a mirror finish. The InP boules were either Sn-doped ($n = 3 \times 10^{18}$ cm$^{-3}$) or S-doped ($n = 4 \times 10^{18}$ cm$^{-3}$). All substrates were n-type and (100) oriented. After cleaning in a boiling chloroform-acetone-methanol solution, they were etched for 10 minutes in a solution of $H_2SO_4{:}H_2O_2{:}H_2O$ (10:1:1) at room temperature. The substrates were then loaded into a graphite slider of a typical 5-well LPE graphite boat. The wells contained typical in charges from which epitaxial InP, InGaAs, or InGaAsP layers are grown.

In the FIGURE, the InP substrate 12 is shown inside a cylindrical quartz saturation chamber 20, downstream from the graphite LPE melt holder 14. A solution 22 of Sn-In-P was prepared by combining polycrystalline InP and Sn shots (etched in concentrated HCl) and loaded into the quartz chamber, under the slider. The ratio of InP to Sn in solution 22 was in excess of the solubility of InP in pure Sn at the temperatures of interest so that the solution was saturated. Illustratively, InP constituted 10% by weight of the total Sn-In-P mixture.

During the first part of a typical LPE cycle, the InP substrate 12 was subject to a temperature increase, first to 720 degrees C. for 40 minutes in order to melt the In charges and to homogenize the indium melts and their components, and secondly to a step cooling period of 1 hr. 20 mins. to the growth temperature of 645 degrees C. After this period, the substrate was either introduced under the first indium melt when a multilayer growth was desired, or the whole assembly was cooled down when a test run was performed.

The experiment was performed using palladium diffused hydrogen as the ambient gas in the LPE reactor (furnace 30) during heat treatment or growth. Ultra-high purity helium was used during loading and unloading the system. After the cycle was completed, the quartz chamber 20 was removed and weighed.

Newly polished InP substrates, InP substrates heat-treated while protected using the quartz saturation chamber, and InP substrates protected using the cover wafer method, were examined with single crystal and double crystal diffractometry. The diffraction conditions in every instance consisted of the asymmetric $\vec{y} = <511>$ at a 27 degree angle of incidence.

The photoluminescence of the substrate after various treatments was recorded using an Argon laser for excitation and a grating monochromator. The samples were etched for 2 mins. in HF at room temperature to remove any surface oxide before photoluminescence spectra were recorded because irreproducible intensity values were obtained when this etching step was omitted. The effectiveness of the phosphorus saturation chamber protection method was compared to the cover wafer for Sn-doped InP and S-doped InP substrates.

Photomicrographs using a Nomarski contrast microscope were also taken of the substrate surface before and after thermal treatment in order to evaluate visible thermal degradation of the InP substrates.

Thermal decomposition of InP substrates begins as soon as a substrate is exposed to the high temperatures (above about 400° C.) needed for the various melts to be fully homogenized. Since the thermal decomposition of InP is due to a loss of phosphorus, our method of providing an excess phosphorus vapor pressure contained inside a small volume chamber in the immediate vicinity of the substrate eliminates the phosphorus loss.

Our approach offers two major advantages: first, the excess phosphorus vapor pressure is always greater than the phosphorus pressure in equilibrium with the substrate thereby counteracting the loss of phosphorus from the substrate and significantly reducing its thermal degradation during the thermal cycle; secondly, the excess phosphorus vapor is spatially contained by the specially designed quartz chamber, in the immediate vicinity of the InP substrate to be protected, thereby maximizing the protection of the substrate while minimizing the contamination of the melts by excess phosphorus. The latter point is of particular importance when InGaAsP or InGaAs layers are grown from slightly supersaturated indium melts.

It has been shown that for indium and tin solutions saturated with InP, the phosphorus vapor pressure ($P_2$ and $P_4$) is greater above the tin solutions at all temperatures between 500-800 degrees C. The temperature dependence of the vapor pressure for these solutions has been expressed as:

$$InP{:}In \ln p = \frac{-\Delta H^{In}}{RT} + C^{In} = k^{In}(T) \quad (1)$$

$$InP{:}Sn \ln p = \frac{-\Delta H^{Sn}}{RT} + C^{Sn} = k^{Sn}(T) \quad (2)$$

where p is the partial pressure of $P_2$ or $P_4$.

Because of the less than perfect fit between the saturation chamber and the graphite slider, the chamber was somewhat leaky, a situation easily correctable by more careful design and machining. Thus, upon continued use of a saturation chamber initially charged with InP and Sn, the phosphorus lost due to leakage was replenished in the solution by the dissolution of some of the excess InP. As this process continued, the solution became enriched in indium and the equilibrium phosphorus pressure changed to values intermediate those predicted by equations (1) and (2). We have evaluated the magnitude of these changes under typical LPE conditions by monitoring the weight loss of a saturation chamber at constant temperature for a sequence of time intervals. Provided the leakage areas were small compared to the total internal surface area, the chamber behaved as an effusion cell. Thus, the weight loss was proportional to the phosphorus pressure (In and Sn vapor pressures are negligible at these temperatures). Simultaneously, InP substrates were protected in the saturation chamber during these experiments for subsequent evaluation by photoluminescence. Plots of phosphorus weight loss versus $X_{In}$ for a quartz saturation chamber at 690 degrees C. (40 mins. exposure time) indicated that although the change in composition was small ($0.07 < X_{In} < 0.2$), a rather large decrease in phosphorus pressure was observed (nearly a factor of 6).

In order to evaluate whether or not this change in phosphorus overpressure affected the protection of the substrate, the protected, Sn-doped substrates were examined by photoluminescence before and after heat treatment. Measurements of photoluminescence (PL) intensity of InP substrates at room temperature were used by H. C. Casey et al., *Applied Physics Letters,* Vol. 30, p. 247 (1977), to illustrate the relationship existing between electrical properties such as the net carrier density, the surface recombination velocity, and the PL peak intensity. Moreover, the diffusion length of the minority carriers in n-type InP is 1 to 2 $\mu$m, so that PL may be considered to be a surface sensitive measurement technique. Variations of PL intensity can, therefore, indicate the presence of a surface layer having electrical characteristics significantly different from those of the bulk. Furthermore, comparisons of PL intensity changes for Sn-doped and S-doped InP substrates were considered to be meaningful since the net carrier densities, hole diffusion lengths, and integrated PL intensities of non-heat-treated samples were similar.

The integrated PL intensity ratio of treated-to-untreated samples was plotted versus $X_{In}$. Variations in intensity over either the sample or reference wafer surfaces gave ~10-20% variations in the PL intensity ratios. Despite the error associated with these measurements, it is clear that, although there was a strong variation in phosphorus vapor pressure above the substrate, the protection, as determined by PL intensity, remained relatively constant. Similar results at lower temperatures (600 degrees C.) were also obtained in spite of the much lower phosphorus vapor pressure of the Sn-In-P solution (~6 times smaller). Moreover, an additional advantage of lower temperature was that the phosphorus partial pressure was lower, hence, the phosphorus loss of the saturation chamber was lower, resulting in a longer useful life of the chamber before recharging it.

Another characterization technique used to determine the thermal degradation of InP substrates was Nomarski contrast photographs. The surface morphologies of S-doped and Sn-doped substrates were observed for different substrate protection methods. Two substrates which were protected by the quartz chamber did not exhibit any observable or measurable thermal damage features, while only the S-doped substrate remained free from etch pits when the cover wafer method was used.

A further comparison of protection methods for differently doped substrates was illustrated by the PL spectra of S-doped and Sn-doped substrates. It was found that S-doped substrates protected by a cover wafer exhibited a PL intensity 20% of the value for untreated substrates. The S-doped substrate protected by the quartz saturation chamber, however, retained all its PL efficiency. In contrast, only 30-35% of the PL peak intensity remained after thermal cycling for a Sn-doped substrate protected by the quartz chamber. Similar results were obtained when helium was used instead of hydrogen as a carrier gas.

The following table summarizes the integrated PL peak intensities for these various substrates.

| Substrate | Protection | Temperature (°C.) | PL Intensity Ratio |
|---|---|---|---|
| Sn:InP | saturation chamber | 720 | 0.35 |
| Sn:InP | saturation chamber | 600 | 0.53 |
| S:InP | saturation chamber | 720 | 1.00 |
| S:InP | InP cover wafer | 720 | 0.23 |
| S:InP | none | 720 | <0.02 |

In measuring the PL intensity ratio, a non-thermally cycled substrate was taken as a reference. It was found that S-doped and Sn-doped substrates were well protected by the phosphorus saturation chamber when compared to the results of the cover wafer technique. Furthermore, the use of hydrogen instead of an inert gas as a carrier gas did not increase the thermal degradation when the saturation chamber was used in contrast to prior art results using a cover wafer. See, for example, K. Pak et al, *Japanese Journal of Applied Physics,* Vol. 18, p. 1859 (1979). This result, again, exemplifies the substrate protection enhancement brought about by a localized excess phosphorus partial pressure in accordance with our invention.

In order to determine the depth of the thermal damage suffered by the substrates protected by the quartz saturation chamber, the PL intensity was measured after progressive removal of the damaged surface by chemical etchings in $H_2SO_4:H_2O_2:H_2O$ (10:1:1). Graphs of average PL intensity ratio versus etching depth for Sn-doped substrates showed that a surface layer of 300 to 500 Angstroms had significantly greater damage than the bulk of the substrates. However, even after removing 10 μm of InP, the average PL intensity ratio was still below the value of the untreated sample, indicating that a minor permanent damage remained in Sn-doped substrates protected by the quartz saturation chamber. This PL reduction was not present in S-doped substrates, however, suggesting that different surface properties influence the PL intensities measured for S-doped or Sn-doped substrates.

Indeed, it has been reported that Fe migrates to the surface of semi-insulating InP substrates during liquid phase epitaxy, resulting in an iron rich surface layer of 0.2 μm depth. As expected, the low temperature PL peak intensity showed a marked increase after heat treatment due to the redistribution of iron dopant at the surface. The use of a simple diffusion model to explain this iron migration was, however, inadequate, and it was suggested that an extensive dislocation network, as well as a high concentration of phosphorus vacancies created during heat treatment, promoted this substrate degradation. Similar dopant migration phenomena should therefore be expected in S-doped and Sn-doped substrates, with a modification of the surface layer PL characteristics. For example, an increase of the Sn dopant concentration in the surface layer, enhanced by the large dislocation density of Sn-doped substrates, would decrease the PL intensity of such a substrate. An S-doped substrate, however, contains a much lower dislocation density, resulting in a negligible surface accumulation of S dopant. A poor protection technique used would also affect the PL intensity since phosphorus vacancies enhance the dopant out-diffusion.

Another possible mechanism which could lower the PL intensity is related to the presence of a high recombination velocity surface layer. We graphed the variation of the PL intensity versus the surface recombination velocity S. For a given doping density, a drastic reduction of the PL intensity occurred when the surface recombination velocity was larger than $10^3$–$10^4$ cm/sec, the widely reported value for n-type InP. The cause of this high surface recombination velocity may possibly be due to a high concentration of nonradiative recombination centers, such as phosphorus vacancies and phosphorus vacancy complexes, as well as microprecipitates surrounding dislocations. In any event, improving the substrate protection before LPE growth is an important step to eliminate the degraded surface layer where nonradiative recombination centers are present.

The third characterization technique used in our study was X-ray diffractometric measurements. A newly polished InP substrate was considered to be the comparison standard for the X-ray measurements. A 120 arc sec $K\alpha_1$ half-peak width was measured with the single crystal arrangement, and a 7 arc sec half-peak width was measured with the double crystal arrangement. These half-peak widths were identical to those achieved with the instrumental standard, a thick, dislocation free, Ge crystal. The double crystal diffractometric measurements of the heat-treated InP substrate protected with quartz saturation chamber or without any protection resulted in diffraction peaks of 9 and 10 arc sec half-peak width, respectively, a negligible variation. The X-ray diffractometric measurements therefore indicate that thermally treated InP substrates do not suffer any substantial lattice changes during pre-epitaxial heat treatment.

Using this new protection method, and without any melt-back step being employed, InGaAsP-InP stripe geometry double heterostructure lasers and buried heterostructure lasers operating CW at 1.3 μm have been prepared. Both types of lasers were fabricated with low thresholds (<150 mA or <50 mA, respectively) and high chip yields ($\gtrsim$60–70%).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although the experiments described above involved the protection of n-type, S-doped and Sn-doped, InP substrates using a saturated Sn-In-P solution 22 in the chamber 20, we also performed similar experiments, and obtained similar results, on semi-insulating Fe-doped InP substrates. In addition, our invention is equally applicable (1) to other solutions which supply the requisite partial pressure of P (e.g., a Cd, Bi or P solvent in which InP is dissolved); (2) to the use of an external source of P (e.g., phosphine) piped into and out of the chamber; (3) to p-InP (e.g., Zn:InP or Cd:InP) using, for example, a saturated solution 22 of Cd-In-P; (4) to other Group III-V compound substrates such as GaAs or GaSb in conjunction with suitable solutions 22 of As or Sb, respectively; and (5) to substrates other than Group III-V compounds such as Group II-VI compounds, wherein thermal decomposition of the substrate during epitaxial growth is a problem.

Finally, it should be noted that our invention is particularly suited to the epitaxial growth of InGaAs layers on InP substrates, a combination which is promising for long wavelength light detectors. When our invention is employed, the substrate is protected and, because the P is confined by the chamber, the InGaAs is not contaminated with P as it would be in other protection techniques which introduce P into the growth atmosphere.

What is claimed is:

1. Apparatus for fabricating a semiconductor device by the liquid phase epitaxy growth of an epitaxial layer on a compound semiconductor single crystal substrate containing a relatively volatile element, comprising
   a solution holder having a well therein for containing a first solution from which said layer is to be grown,
   a slider having a recess therein for carrying said substrate to a position under said well,
   said holder and said slider being translatable relative to one another for bringing said solution and said substrate into contact with one another, and
   a closed chamber which
   (1) is located external to said solution holder,
   (2) is adapted to permit said slider to translate therethrough,
   (3) is capable of surrounding said substrate,
   (4) has a top portion above said slider and a bottom portion underneath said slider for containing a second solution which includes said volatile element,
   means for moving said slider to position said substrate in said chamber,
   means for heating said substrate and said solutions to a temperature suitable for growth of said layer and which causes said volatile element to evaporate from said second solution, so that the partial pressure of said volatile element in said chamber reduces thermal decomposition of said substrate, and
   means for removing said substrate from said chamber and for bringing it into contact with said first solution for a time period effective to grow said layer to the desired thickness.

2. The apparatus of claim 1 wherein said chamber comprises a pair of opposing end faces each having a slot therein adapted to receive said slider and to permit translation of said slider therethrough.

3. The apparatus of claim 2 wherein the width of each of said slots is less than the width of each of said end faces, so that the bottom and top of said chamber are in gas flow communication with one another.

* * * * *